US010668558B2

(12) United States Patent
Takebayashi et al.

(10) Patent No.: US 10,668,558 B2
(45) Date of Patent: *Jun. 2, 2020

(54) METAL WIRING BONDING STRUCTURE AND PRODUCTION METHOD THEREFOR

(71) Applicant: NGK INSULATORS, LTD., Nagoya (JP)

(72) Inventors: Hiroshi Takebayashi, Handa (JP); Natsuki Hirata, Handa (JP); Rishun Kin, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 479 days.

This patent is subject to a terminal disclaimer.

(21) Appl. No.: 15/461,902

(22) Filed: Mar. 17, 2017

(65) Prior Publication Data
US 2017/0290099 A1 Oct. 5, 2017

Related U.S. Application Data

(60) Provisional application No. 62/314,547, filed on Mar. 29, 2016, provisional application No. 62/314,556, filed on Mar. 29, 2016.

(30) Foreign Application Priority Data

Jun. 29, 2016 (JP) .................................. 2016-128765
Jun. 29, 2016 (JP) .................................. 2016-128766

(51) Int. Cl.
*B23K 20/00* (2006.01)
*B23K 3/04* (2006.01)
(Continued)

(52) U.S. Cl.
CPC .......... *B23K 20/004* (2013.01); *B23K 1/0016* (2013.01); *B23K 3/04* (2013.01);
(Continued)

(58) Field of Classification Search
CPC ............... B23K 1/0016; B23K 20/004; B23K 2101/42; B23K 3/04; H01L 21/67069;
(Continued)

(56) References Cited

U.S. PATENT DOCUMENTS 4,795,079 A 1/1989 Yamada
5,421,081 A * 6/1995 Sakaguchi ............ H05K 1/113
156/256

(Continued)

FOREIGN PATENT DOCUMENTS

JP S59-081061 U 5/1984
JP S61-015392 A1 1/1986
(Continued)

OTHER PUBLICATIONS

Japanese Office Action (Application No. 2016-128765) dated Sep. 25, 2018 (with English translation).
(Continued)

*Primary Examiner* — Dana Ross
*Assistant Examiner* — Ket D Dang
(74) *Attorney, Agent, or Firm* — Burr & Brown, PLLC

(57) ABSTRACT

A metal wiring bonding structure 100 comprises contacts 753 of connection FPC 75 and heater lands 46 of a sheet heater 30 to be bonded by a solder bonding member 766. A connection FPC 75 includes contact opposed lands 754 famed of metal and disposed at positions respectively opposed to the plurality of contacts 753 on a surface of a support layer 751 opposite from a surface on which metal wires 750 are provided, and through holes 755 penetrating the contact opposed lands 754, the support layer 751, and contacts 753. Solder bonding members 756 cover surfaces of contact opposed lands 754 and are filled inside through holes 755 and in a bonding space C.

11 Claims, 12 Drawing Sheets

(51) Int. Cl.
*H05K 3/36* (2006.01)
*H05B 3/14* (2006.01)
*B23K 1/00* (2006.01)
*H01L 21/683* (2006.01)
*H05K 1/02* (2006.01)
*H05K 1/11* (2006.01)
*H01L 21/67* (2006.01)
*H05B 3/62* (2006.01)
*B23K 101/42* (2006.01)
*H01R 43/02* (2006.01)
*H05K 3/34* (2006.01)

(52) U.S. Cl.
CPC .... *H01L 21/67103* (2013.01); *H01L 21/6831* (2013.01); *H01L 21/6833* (2013.01); *H05B 3/143* (2013.01); *H05B 3/62* (2013.01); *H05K 1/028* (2013.01); *H05K 1/118* (2013.01); *H05K 3/363* (2013.01); *B23K 2101/42* (2018.08); *H01L 21/67069* (2013.01); *H01R 43/02* (2013.01); *H05K 1/0212* (2013.01); *H05K 3/3494* (2013.01)

(58) Field of Classification Search
CPC ........... H01L 21/67103; H01L 21/6831; H01L 21/6833; H01R 43/02; H05B 3/143; H05B 3/62; H05K 1/0212; H05K 1/028; H05K 1/118; H05K 3/3494; H05K 3/363
USPC ........................................................ 219/521
See application file for complete search history.

(56) References Cited

U.S. PATENT DOCUMENTS

| | | | | |
|---|---|---|---|---|
| 5,646,814 A | * | 7/1997 | Shamouilian | ....... H01L 21/6831 361/234 |
| 7,929,100 B2 | * | 4/2011 | Kim | .................... G02F 1/13452 349/150 |
| 10,029,328 B2 | * | 7/2018 | Kin | .......................... B23K 3/04 |
| 2004/0211057 A1 | * | 10/2004 | Totani | .................... H05K 3/361 29/739 |
| 2014/0291006 A1 | * | 10/2014 | Yamamoto | ............ H05K 3/363 174/263 |
| 2015/0208505 A1 | * | 7/2015 | Shen | ...................... H05K 3/363 174/254 |
| 2016/0027678 A1 | | 1/2016 | Parkhe et al. | |

FOREIGN PATENT DOCUMENTS

| | | | | |
|---|---|---|---|---|
| JP | S61-224494 A1 | 10/1986 | | |
| JP | 05-090725 A1 | 4/1993 | | |
| JP | H09-245856 A1 | 9/1997 | | |
| JP | 2002368370 A | * 12/2002 | ............. H05K 3/363 |
| JP | 2005-101026 A1 | 4/2005 | | |
| JP | 2006065213 A | * 3/2006 | | |
| JP | 2015-177082 A1 | 10/2015 | | |
| JP | 2015177082 A | * 10/2015 | | |

OTHER PUBLICATIONS

Japanese Office Action (Application No. 2016-128766) dated Feb. 5, 2019 (with English translation).
U.S. Appl. No. 15/461,930, filed Mar. 17, 2017, Rishun Kin.
Japanese Office Action (Application No. 2016-128765) dated Jun. 25, 2019 (with English translation).
Japanese Decision of Refusal (Application No. 2016-128765) dated Sep. 17, 2019 (with English translation).
Japanese Decision of Dismissal of Amendment (Application No. 2016-128765) dated Sep. 17, 2019 (with English translation).

* cited by examiner

METAL WIRING BONDING STRUCTURE AND PRODUCTION METHOD THEREFOR

BACKGROUND OF THE INVENTION

1. Field of the Invention

The present invention relates to a metal wiring bonding structure and a production method therefor.

2. Description of the Related Art

In a conventionally known structure for bonding a flexible board and a printed board, a contact part, such as a contact pattern, on the flexible board and a corresponding contact part on the printed board are electrically connected by soldering (for example, PTL 1). FIG. 15 illustrates an example of such a bonding structure. A coverlay film 112 is removed from a board end of a flexible board 110, where end portions of copper foil patterns arranged in parallel at a fixed pitch are exposed as a contact pattern 114. The contact pattern 114 is superposed on a contact pattern 124 provided on a printed board 120, and is electrically connected thereto by melting solder attached beforehand to a surface of at least one of the contact pattern 114 and the contact pattern 124.

CITATION LIST

Patent Literature

PTL 1: JP 5-90725 A

SUMMARY OF THE INVENTION

However, in the bonding structure of FIG. 15, the amount of solder attached to the surface of at least one of the contact pattern 114 and the contact pattern 124 is sometimes insufficient. Also, when the solder is melted, heat does not spread over the entire solder, and this sometimes causes connection failure.

The present invention has been made to solve the above-described problems, and a main object of the invention is to firmly bond a first member having first contacts and a second member having second contacts.

The present invention provides a metal wiring bonding structure including:

a first member having a plurality of first metal wires between a first support layer formed of resin and a first covering layer formed of resin, and first contacts serving as end portions of the first metal wires and exposed from the first covering layer;

a second member having a plurality of second contacts on a surface of a second support layer famed of resin, the second contacts being respectively disposed opposed to the plurality of first contacts; and a bonding member that brazes and solders the first contacts and the second contacts, wherein the first member includes first contact opposed lands formed of metal and disposed at positions respectively opposed to the plurality of first contacts on a surface of the first support layer opposite from a surface on which the first metal wires are provided, and first through holes penetrating the first contact opposed lands, the first support layer, and the first contacts, and wherein the bonding member covers surfaces of the first contact opposed lands and is filled inside the first through holes and in a bonding space between the first contacts and the second contacts.

In this metal wiring bonding structure, the bonding member covers the surfaces of the first contact opposed lands, and is filled inside the first through holes and in the bonding space between the first contacts and the second contacts. When producing the metal wiring bonding structure, a brazing and soldering material melted at the first contact opposed lands can be supplied to the bonding space through the first through holes. For this reason, the brazing and soldering material is more easily supplied to the bonding space than when the first contact opposed lands and the first through holes are not provided. As a result, it is possible to avoid the problem in that bonding is insufficient because the brazing and soldering material is not enough in the bonding space. Further, when the first contact opposed lands are heated, heat thereof is transmitted to the bonding space via the first support layer, and heat of the brazing and soldering material in the melted state is also transmitted to the bonding space. For this reason, the bonding space is entirely heated to high temperature. As a result, the melted brazing and soldering material supplied to the bonding space easily and uniformly wets and spreads inside the bonding space. In this way, it is possible to avoid the problem in that bonding is insufficient because the brazing and soldering material is not enough in the bonding space. Moreover, since the brazing and soldering material uniformly wets and spreads inside the bonding space, the first contacts and the second contacts are bonded firmly.

The term "brazing and soldering" refers to soldering (the melting temperature is less than 450° C.) and brazing (the melting temperature is 450° C. or more).

In the metal wiring bonding structure of the present invention, the first through holes may have a transverse cross section shaped like a circle, an ellipse, or a rectangle with round corners. This allows the brazing and soldering material melted at the first contact opposed lands to smoothly pass through the first through holes. In particular, the cross section is preferably shaped like an ellipse or a rectangle with round corners. Usually, the first contacts are often shaped like a rectangle in plan view. Hence, when the first through holes having a cross section shaped like an ellipse or a rectangle with round corners so that the longer diameter of the cross section extends along the longer side of the rectangle, the aperture area of the first through holes can be increased. As a result, the brazing and soldering material melted at the first contact opposed lands more smoothly reaches the bonding space.

In the metal wiring bonding structure of the present invention, inner walls of the first through holes may be covered with metal films. This allows the brazing and soldering material melted at the first contact opposed lands to easily wet and spread on the inner walls of the first through holes.

In the metal wiring bonding structure of the present invention, a number of the first through holes provided for each of the first contacts may be two or more. This allows the brazing and soldering material melted at the first contact opposed lands to efficiently reach the bonding space.

In the metal wiring bonding structure of the present invention, the second contacts may respectively include extended surfaces opposed to imaginary extended portions imaginarily extended ahead from the first contacts in addition to base surfaces opposed to the first contacts, and the bonding member may cover the surfaces of the first contact opposed lands, a distal end surface of the first member, and the extended surfaces of the second contacts, and may be filled inside the first through holes and in the bonding space. In this case, since portions of the bonding member that cover the surfaces of the first contact opposed lands and the distal end surface of the first member can be inspected from the outside, the connection state can be checked easily.

In the metal wiring bonding structure of the present invention, the first member may be a flexible printed circuit board (FPC). This enables firm bonding of the first contacts of the FPC and the second contacts of the second member.

In the metal wiring bonding structure of the present invention, the second member may be a sheet heater functioning as a heater and disposed between an electrostatic chuck and a support pedestal formed of metal, and the first member may be inserted in a through hole of the support pedestal to be bonded to the second member. In this case, in an electrostatic chuck heater in which the sheet heater is disposed between the electrostatic chuck and the support pedestal, the first contacts of the first member and the second contacts of the sheet heater can be bonded firmly.

The present invention provides a production method for a metal wiring bonding structure, including:

(a) a step of preparing a first member having a plurality of first metal wires between a first support layer fouled of resin and a first covering layer formed of resin, first contacts serving as end portions of the first metal wires and exposed from the first covering layer, first contact opposed lands formed of metal and disposed at positions respectively opposed to the plurality of first contacts on a surface of the first support layer opposite from a surface on which the first metal wires are provided, and first through holes penetrating the first contact opposed lands, the first support layer, and the first contacts, and a second member having a plurality of second contacts on a surface of a second support layer formed of resin, (b) a step of heating and melting a brazing and soldering material in contact with the first contact opposed lands in a state in which the first contacts and the second contacts are opposed to each other, supplying the melted brazing and soldering material from the first contact opposed lands to a bonding space between the first contacts and the second contacts through the first through holes, and melting a preliminary brazing and soldering material by heat transfer in case the first contacts and the second contacts are temporarily bonded with the preliminary brazing and soldering material beforehand; and (c) a step of hardening the entire brazing and soldering material.

In this production method for the metal wiring bonding structure, the brazing and soldering material is heated and melted by contact with the first contact opposed lands in the state in which the first contacts and the second contacts are opposed to each other. Then, the brazing and soldering material melted at the first contact opposed lands is supplied to the bonding space through the first through holes. For this reason, the brazing and soldering material is more easily supplied to the bonding space than when the first contact opposed lands and the first through holes are not provided. As a result, it is possible to avoid the problem in that bonding is insufficient because the brazing and soldering material is not enough in the bonding space. Also, the first contact opposed lands are heated, heat thereof is transmitted to the bonding space via the first support layer, and heat of the melted brazing and soldering material is also transmitted to the bonding space. For this reason, the bonding space is entirely heated to high temperature. As a result, the melted brazing and soldering material supplied to the bonding space easily and uniformly wets and spreads inside the bonding space. When the first contacts and the second contacts are temporarily bonded with a preliminary brazing and soldering material beforehand, the preliminary brazing and soldering material is melted by heat transfer, and combines with the melted brazing and soldering material supplied to the bonding space. After that, the melted brazing and soldering material is hardened. The bonding member obtained by hardening the brazing and soldering material covers the surfaces of the first contact opposed lands, and is filled inside the first through holes and in the bonding space. In this way, the problem in that bonding is insufficient because the brazing and soldering material is not enough in the bonding space is avoided. Moreover, since the brazing and soldering material uniformly wets and spreads inside the bonding space, the first contacts and the second contacts are bonded firmly.

In the production method for the metal wiring bonding structure according to the present invention, the first through holes may have a transverse cross section shaped like a circle, an ellipse, or a rectangle with round corners. This allows the brazing and soldering material melted at the first contact opposed lands to smoothly pass through the first through holes. In particular, the transverse cross section is preferably shaped like an ellipse or a rectangle with round corners.

In the production method for the metal wiring bonding structure according to the present invention, inner walls of the first through holes may be covered with metal films. This allows the brazing and soldering material melted at the first contact opposed lands to easily wet and spread on the inner walls of the first through holes.

In the production method for the metal wiring bonding structure according to the present invention, a number of the first through holes provided for each of the first contacts may be two or more. In this case, the brazing and soldering material melted at the first contact opposed lands efficiently reaches the bonding space.

In the production method for the metal wiring bonding structure according to the present invention, the second contacts may include extended surfaces opposed to imaginary extended portions imaginarily extended ahead from the first contacts in addition to base surfaces opposed to the first contacts, and, in the step (b), further, the melted brazing and soldering material may reach from the first contact opposed lands to the bonding space between the first contacts and the second contacts through a distal end surface of the first member and the extended surfaces of the second contacts. In this case, since portions of the bonding member that cover the surfaces of the first contact opposed lands and the distal end surface of the first member can be inspected from the outside, the connection state can be checked easily. When the first contacts of the first member are positioned to be opposed to the second contacts of the second member, the extended surfaces of the second contacts and the first contact opposed lands are both seen from above the first member. By using these elements, positioning can be performed easily.

In the production method for the metal wiring bonding structure according to the present invention, the first member may be a flexible printed circuit board (FPC). The second member may be a sheet heater functioning as a heater and may be disposed between an electrostatic chuck and a support pedestal formed of metal. The first member may be inserted in a through hole of the support pedestal to be bonded to the second member.

DETAILED DESCRIPTION OF THE INVENTION

Figure 1:
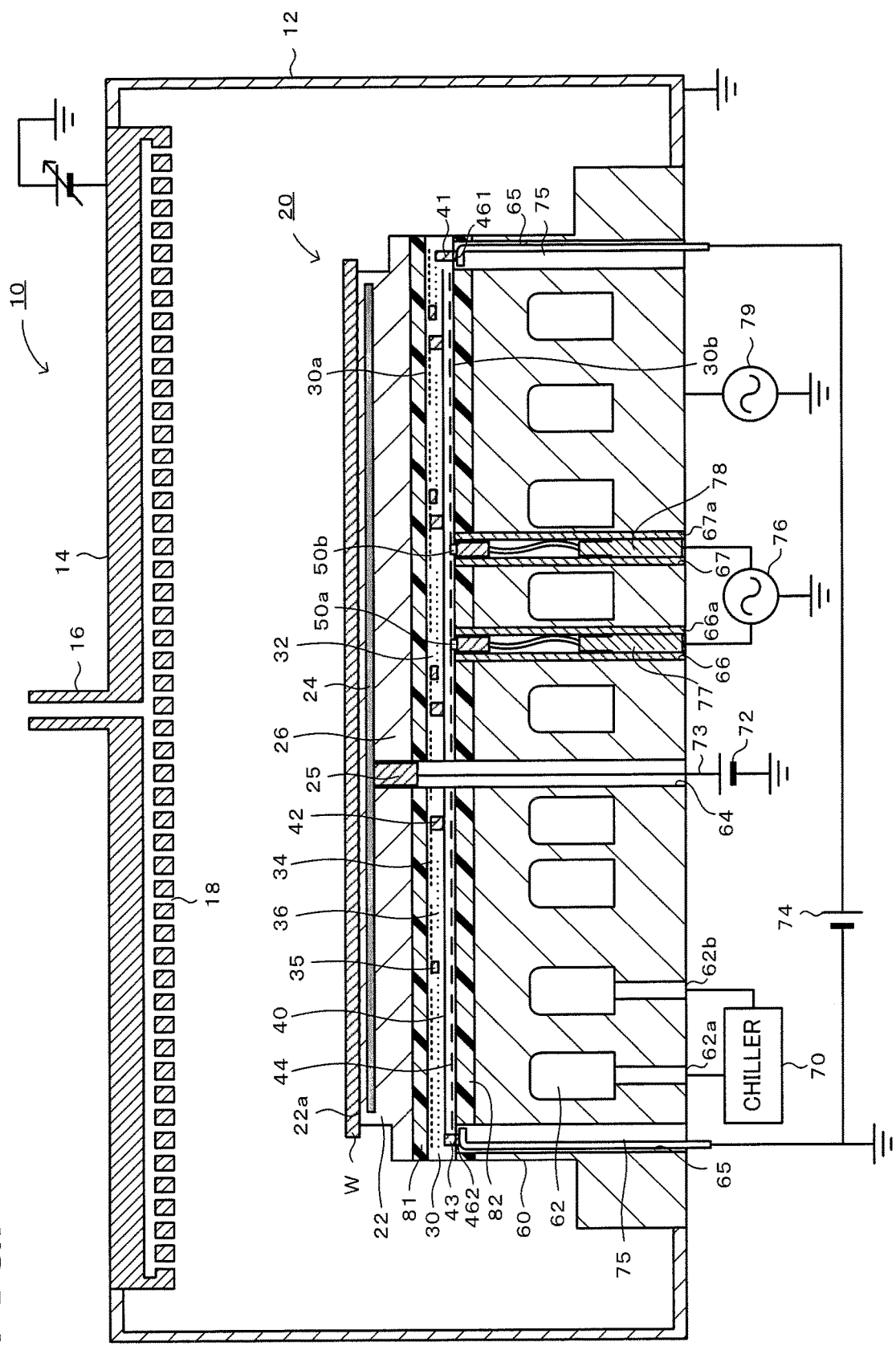
FIG. 1 is a cross-sectional view illustrating a schematic configuration of a plasma treatment apparatus 10.
Figure 2:
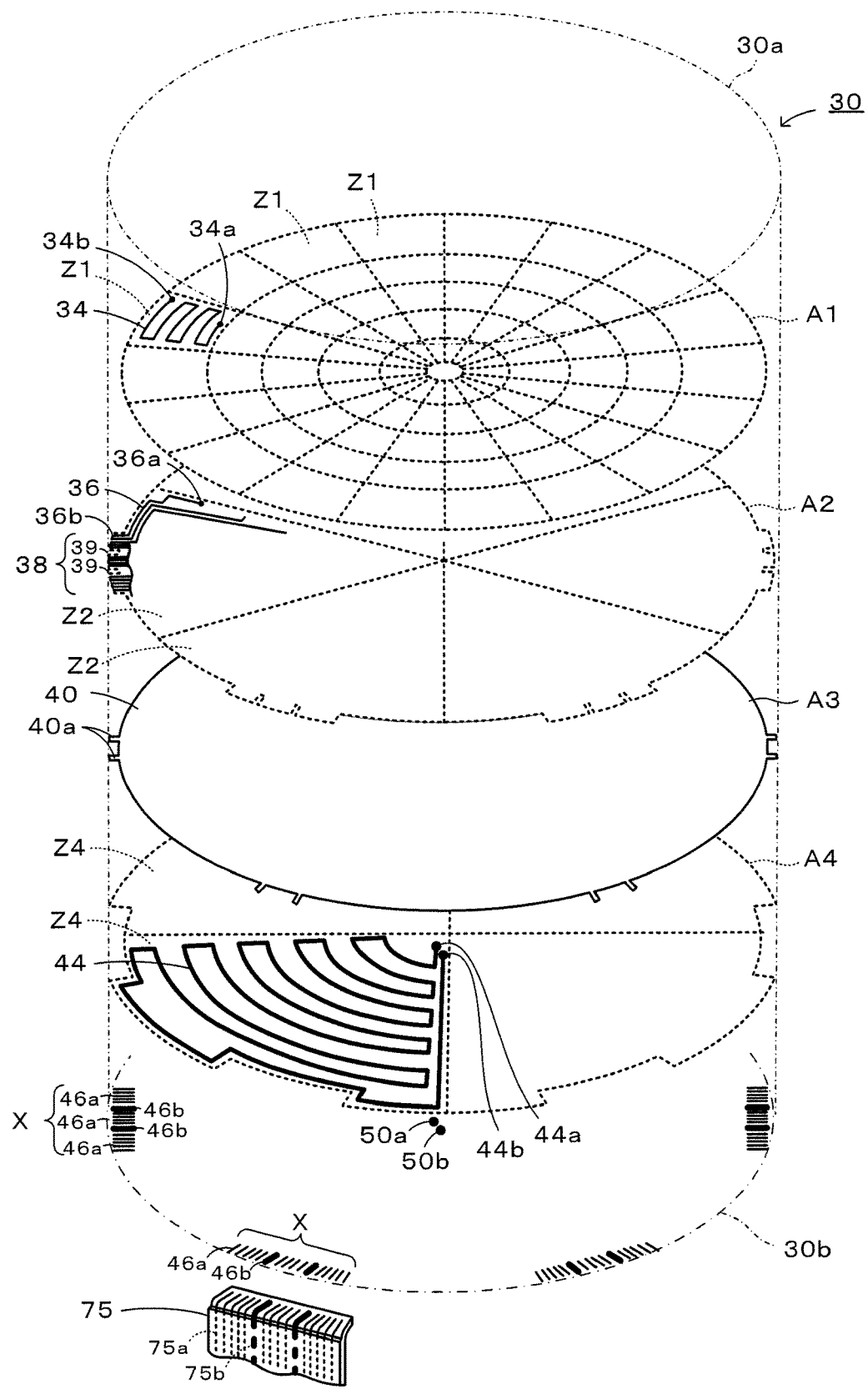
FIG. 2 is a perspective view illustrating an internal structure of a sheet heater 30.

A preferred embodiment of the present invention will be described below with reference to the drawings. FIG. 1 is a cross-sectional view illustrating a schematic configuration of a plasma treatment apparatus 10, and FIG. 2 is a perspective view illustrating an internal structure of a sheet heater 30.

As illustrated in FIG. 1, the plasma treatment apparatus 10 serving as a semiconductor manufacturing apparatus includes a vacuum chamber 12, a shower head 14, and an electrostatic chuck heater 20. The vacuum chamber 12 is a box-shaped container formed of, for example, an aluminum alloy. The shower head 14 is provided in a ceiling surface of the vacuum chamber 12. The shower head 14 releases process gas supplied from a gas introduction pipe 16 into the vacuum chamber 12 through multiple gas injection ports 18. Also, the shower head 14 functions as a cathode plate for plasma generation. The electrostatic chuck heater 20 is a device that attracts and holds a wafer W on a wafer mounting surface 22a. Hereinafter, the electrostatic chuck heater 20 will be described in detail.

The electrostatic chuck heater 20 includes an electrostatic chuck 22, a sheet heater 30, and a support pedestal 60. A lower surface of the electrostatic chuck 22 and an upper surface 30a of the sheet heater 30 are bonded together with a first bonding sheet 81 interposed therebetween. An upper surface of the support pedestal 60 and a lower surface 30b of the sheet heater 30 are bonded together with a second bonding sheet 82 interposed therebetween. Examples of the bonding sheets 81 and 82 include a sheet in which an acrylic resin layer is provided on each surface of a core material formed of polypropylene, a sheet in which a silicone resin layer is provided on each surface of a core material formed of polyimide, and a sheet formed of epoxy resin alone.

The electrostatic chuck 22 is a disc-shaped member in which an electrostatic electrode 24 is embedded in a ceramic sintered body 26. Examples of the ceramic sintered body 26 include an aluminum nitride sintered body and an alumina sintered body. An upper surface of the electrostatic chuck 22 serves as a wafer mounting surface 22a on which a wafer W is mounted. The thickness of the ceramic sintered body 26 is preferably 0.5 to 4 mm, although not particularly limited.

The sheet heater 30 is a disc-shaped member in which correction heater electrodes 34, jumper lines 36, a ground electrode 40, and reference heater electrodes 44 are built in a heat-resistant resin sheet 32. Examples of the material of the resin sheet 32 include polyimide resin and a liquid crystal polymer. The sheet heater 30 includes a first electrode region A1 to a fourth electrode region A4 provided parallel to the upper surface 30a of the sheet heater 30 and having different heights (see FIG. 2).

A first electrode region A1 is divided into multiple zones Z1 (for example, 100 zones or 300 zones). In each of the zones Z1, a correction heater electrode 34 is routed all over the zone Z1 from one end 34a to the other end 34b in the shape of a single brush stroke. In FIG. 2, imaginary lines are drawn by dotted lines in the first electrode region A1, and portions surrounded by the imaginary lines are referred to as zones Z1. While the correction heater electrode 34 is shown only in one zone Z1 in FIG. 2 for convenience, similar correction heater electrodes 34 are provided in the other zones Z1. The outer shape of the sheet heater 30 is shown by one-dot chain lines.

In a second electrode region A2, jumper lines 36 are provided to respectively supply power to the plural correction heater electrodes 34. For this reason, the number of jumper lines 36 is equal to the number of correction heater electrodes 34. The second electrode region A2 is divided into a number of zones Z2 smaller than the number of zones Z1 (for example, 6 zones or 8 zones). In FIG. 2, imaginary lines are drawn by dotted lines in the second electrode region A2, and portions surrounded by the imaginary lines are referred to as zones Z2. While a jumper line 36 (a part) is shown only in one zone Z2 for convenience in FIG. 2, similar jumper lines 36 are provided in the other zones Z2. In the description of the embodiment, it is assumed that, when one zone Z2 is projected onto the first electrode region A1, a plurality of correction heater electrodes 34 included in the projection area belong to the same group. One end 34a of each of the correction heater electrodes 34 belonging to one group is connected to one end 36a of the jumper line 36 in the zone Z2 corresponding to the group through a via 35 penetrating a portion between the first electrode region A1 and the second electrode region A2 in the up-down direction (see FIG. 1). The other end 36b of the jumper line 36 is extended out to an outer peripheral region 38 provided in the zone Z2. As a result, the other ends 36b of the jumper lines 36 connected to the correction heater electrodes 34 belonging to the same group are collectively disposed in one outer peripheral region 38. In regions X where outer peripheral regions 38 are projected onto the lower surface 30b of the sheet heater 30, jumper lands 46a connected to the other ends 36b of the jumper lines 36 through vias 41 (see FIG. 1) are arranged side by side. In other words, the plural jumper lands 46a are arranged in the same region X and exposed outside so that two or more jumper lands 46a form a group. The specific resistance of the correction heater electrodes 34 is preferably higher than or equal to the specific resistance of the jumper lines 36.

In a third electrode region A3, a ground electrode 40 common to the plural correction heater electrodes 34 is provided. The correction heater electrodes 34 are connected to the ground electrode 40 through vias 42 extending from the first electrode region A1 to the third electrode region A3 through the second electrode region A2 (see FIG. 1). The ground electrode 40 has projections 40a projecting outward from the outer periphery. These projections 40a are provided at positions opposed to cutouts 39 in the corresponding outer peripheral regions 38. The projections 40a are connected to ground lands 46b provided on the lower surface 30b of the sheet heater 30 through vias 43 (see FIG. 1). The ground lands 46b are provided together with the jumper lands 46a in the region X of the lower surface 30b of the sheet heater 30.

A fourth electrode region A4 is divided into a number of zones Z4 smaller than the total number of correction heater electrodes 34 provided in the first electrode region A1 (for example, 4 zones or 6 zones). In each of the zones Z4, a reference heater electrode 44 of an output higher than that of the correction heater electrodes 34 is routed over the entire zone Z4 from one end 44a to the other end 44b in the shape of a single brush stroke. In FIG. 2, imaginary lines are drawn by dotted lines in the fourth electrode region A4, and portions surrounded by the imaginary lines are referred to as zones Z4. While the reference heater electrode 44 is shown only in one zone Z4 for convenience in FIG. 2, similar reference heater electrodes 44 are also provided in the other zones Z4. Both ends 44a and 44b of each of the reference heater electrodes 44 are connected to a pair of reference lands 50a and 50b provided on the lower surface 30b of the sheet heater 30 through unillustrated vias extending from the fourth electrode region A4 to the lower surface 30b of the sheet heater 30.

As illustrated in FIG. 1, the support pedestal 60 is a disc-shaped member formed of metal such as Al or an Al alloy, and a refrigerant flow passage 62 is provided therein. A chiller 70 for adjusting the temperature of the refrigerant is connected to an entrance 62a and an exit 62b of the refrigerant flow passage 62. When the refrigerant is supplied from the chiller 70 to the entrance 62a of the refrigerant flow passage 62, it passes through the refrigerant flow passage 62 extending all over the support pedestal 60, is returned from the exit 62b of the refrigerant flow passage 62 to the chiller 70, is cooled to a setting temperature inside the chiller 70, and is then supplied to the entrance 62a of the refrigerant flow passage 62 again. The support pedestal 60 has a plurality of types of through holes 64 to 67 penetrating the support pedestal 60 in the up-down direction. The through hole 64 is a hole through which a power feed terminal 25 of the electrostatic electrode 24 is exposed outside. The through holes 65 are holes through which land groups (jumper lands 46a and ground lands 46b, see FIG. 2) provided in the regions X on the lower surface 30b of the sheet heater 30 are exposed outside. The through holes 66 and 67 allow the reference lands 50a and 50b of the reference heater electrodes 44 to be exposed outside therethrough. Electric insulating cylinders 66a and 67a are inserted in the through holes 66 and 67, respectively. The support pedestal 60 further includes, for example, unillustrated through holes in which lift pins for lifting up the wafer W are moved up and down.

The plasma treatment apparatus 10 further includes an electrostatic-chuck power supply 72, a correction-heater power supply 74, a reference-heater power supply 76, and an RF power supply 79. The electrostatic-chuck power supply 72 is a direct-current power supply, and is connected to the power feed terminal 25 of the electrostatic electrode 24 with a power feeding rod 73 inserted in the through hole 64 being interposed therebetween. The correction-heater power supply 74 is a direct-current power supply, and is connected to the jumper lands 46a and the ground lands 46b in the correction heater electrodes 34 with connection flexible printed circuit boards (connection FPC) 75 serving as metal-wiring assembly inserted in the through holes 65 being interposed therebetween. Specifically, since the jumper lands 46a and the ground lands 46b belonging to the same group illustrated in FIG. 2 are arranged in the same region X, they are connected through one connection FPC 75. The connection FPC 75 is a cable in which metal wires 75a and 75b covered with resin coating are bundled in the form of band, and in an end portion opposed to the region X, the metal wires 75a and 75b are exposed. The metal wires 75a are lead wires that connect the jumper lands 46a to a positive electrode of the correction-heater power supply 74, and the metal wires 75b are lead wires that connect the ground lands 46b to a negative electrode of the correction-heater power supply 74. The reference-heater power supply 76 is an alternating-current power supply, is connected to one reference land 50a of each of the reference heater electrodes 44 through a cable terminal 77 inserted in the through hole 66, and is connected to the other reference land 50b of the reference heater electrode 44 through a cable terminal 78 inserted in the through hole 67. The RF power supply 79 is a power supply for plasma generation, and is connected to supply high-frequency power to the support pedestal 60 functioning as an anode plate. The shower head 14 functioning as the cathode plate is grounded through a variable resistor.

Figure 3:
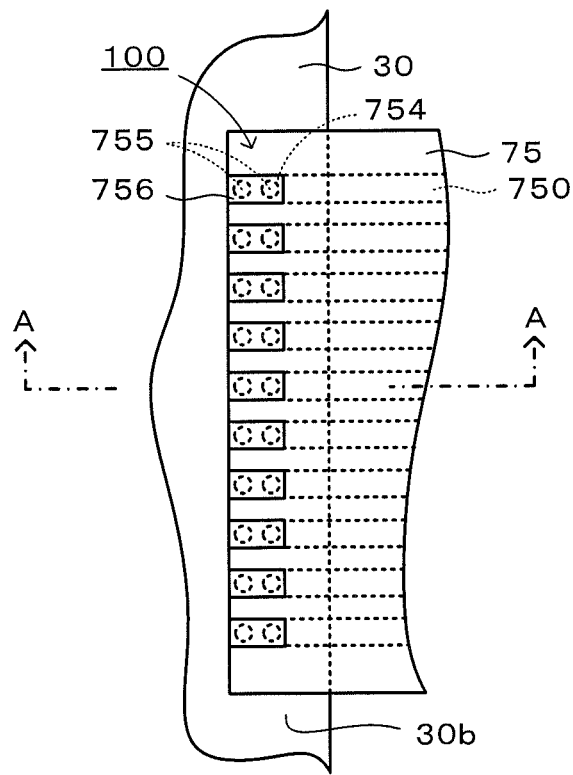
FIG. 3 is a plan view of a metal wiring bonding structure 100 when viewed from a lower surface 30b of the sheet heater 30.
Figure 4:
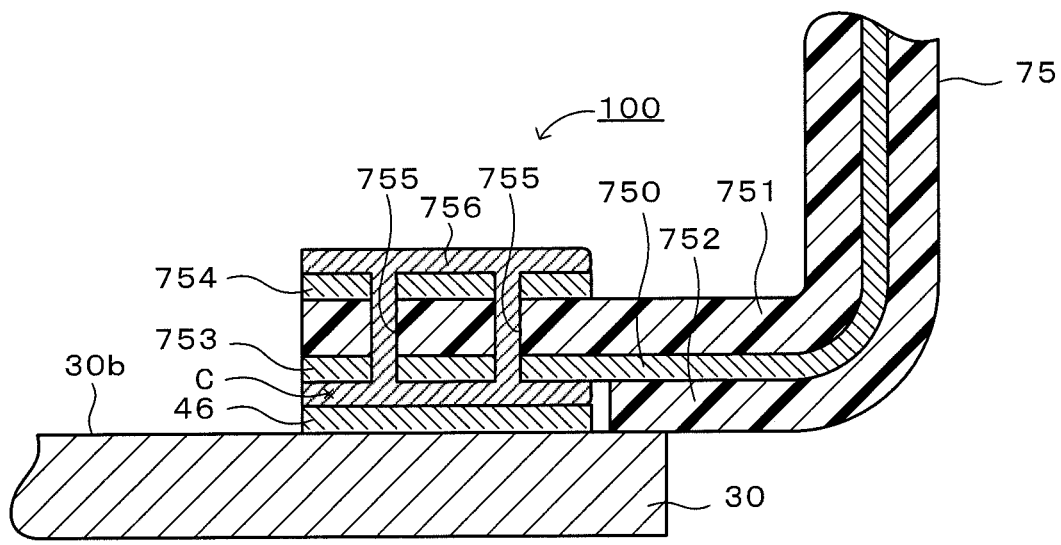
FIG. 4 is a cross-sectional view taken along line A-A of FIG. 3.

Here, a metal wiring bonding structure 100 for the sheet heater 30 and the connection FPC 75 will be described with reference to FIGS. 3 and 4. FIG. 3 is a plan view of the metal wiring bonding structure 100, when viewed from the lower surface 30b of the sheet heater 30, and FIG. 4 is a cross-sectional view taken along line of FIG. 3. For convenience, the jumper lands 46a and the ground lands 46b are not distinguished, but are simply referred to as heater lands 46, and the metal wires 75a and 75b are also not distinguished, but are referred to as metal wires 750. The sheet heater 30 includes a plurality of heater lands 46 (46a, 46b) exposed in the regions X of the lower surface 30b (see FIG. 2). The connection FPC 75 is a flat wire material formed by covering a plurality of metal wires 750 with resin. Specifically, in the connection FPC 75, a plurality of metal wires 750 are provided between a support layer 751 formed of resin and a covering layer 752 formed of resin. Contacts 753 serving as end portions of the metal wires 750 are exposed from the covering layer 752. On a surface of the support layer 751 opposite from a surface provided with the metal wires 750, contact opposed lands 754 formed of metal are provided at positions respectively opposed to the plural contacts 753. The connection FPC 75 has through holes 755. In this example, two through holes 755 are provided. The through holes 755 penetrate the contact opposed lands 754, the support layer 751, and the contacts 753. The through holes 755 have a circular or substantially circular transverse cross section (a cross section taken along the horizontal plane). Solder bonding members 756 cover the surfaces of the contact opposed lands 754 and are filled inside the through holes 755 and in a bonding space C between the contacts 753 and the heater lands 46.

A production method for such a metal wiring bonding structure 100 will be described with reference to FIG. 5.

FIG. 5 include explanatory views illustrating a production process for the metal wiring bonding structure 100.

Figure 5A:
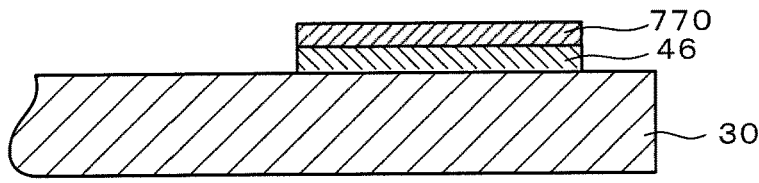
FIGS. 5A to 5D include explanatory views illustrating a production process for the metal wiring bonding structure 100.

First, as illustrated in FIG. 5A, preliminary solder 770 is applied to heater lands 46 on a sheet heater 30. As the preliminary solder 770, for example, solder cream can be used.

Figure 5B:
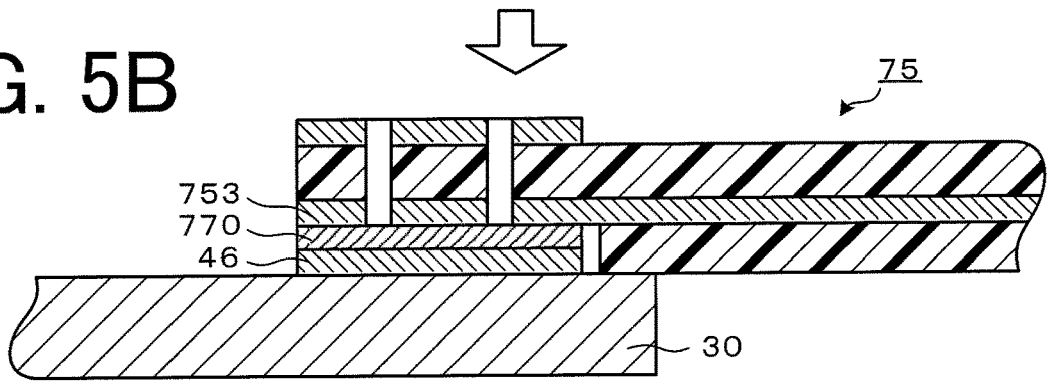

Next, as illustrated in FIG. 5B, a connection FPC 75 is prepared, and is placed in contact with the preliminary solder 770 in a state in which contacts 753 are opposed to the heater lands 46. The connection FPC 75 is prepared through the following procedure. FIG. 6 include explanatory views illustrating a production process for the connection FPC 75. First, a double-sided copper-foiled support layer in which copper foils 761 and 762 are stuck on both surfaces of a resin support layer 751 is prepared (see FIG. 6A). Instead of the copper foils 761 and 762, other metal foils may be used. Next, metal wires 750 are faulted in the copper foil 761 by patterning, and contact opposed lands 754 are formed in the copper foil 762 by patterning (see FIG. 6B). As the method for pattern formation, a wet etching method can be used. Next, the metal wires 750 are covered with a resin covering layer 752. As the method for covering by the resin covering layer 752, a laminating method can be used. However, contacts 753 serving as distal end portions of the metal wires 750 are not covered with the covering layer 752, but are exposed outside (see FIG. 6C). Next, through holes 755 penetrating the contact opposed lands 754, the support layer 751, and the contacts 753 in the up-down direction are fouled, for example, with a drill or a laser (see FIG. 6D), whereby the connection FR 75 is obtained. While the diameter of the through holes 755 is not particularly limited, it is preferably 0.1 mm or more. While the through holes 755 can be easily formed by making the contact opposed lands 754 and the contacts 753 in the same shape, the contact opposed lands 754 and the contacts 753 do not always need to have the same shape as long as the through holes 755 can be formed.

Figure 5C:
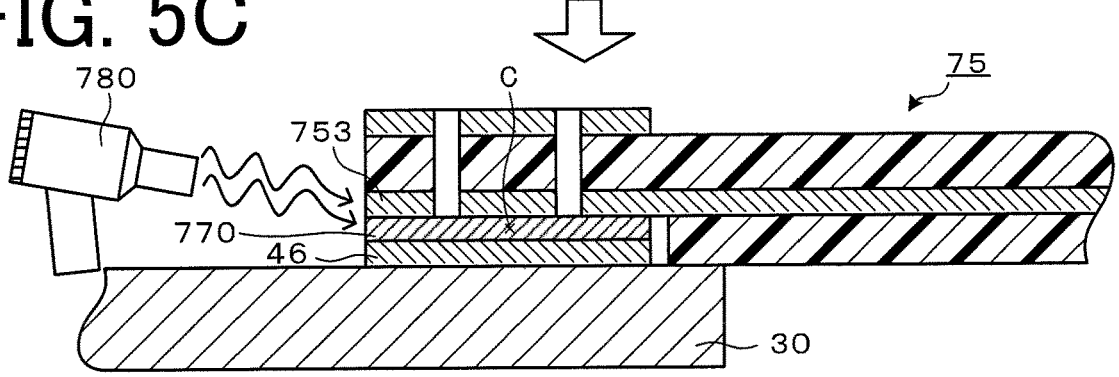

Next, as illustrated in FIG. 5C, the preliminary solder 770 is melted by applying heat from hot air of a spot heater 780, and is then hardened by cooling. The sheet heater 30 and the connection FPC 75 are thereby temporarily bonded. In many cases, a sufficient amount of preliminary solder 770 to fill the bonding space C between the contacts 753 and the heater lands 46 is not ensured, or the preliminary solder 770 is not sufficiently melted because heat from the spot heater 780 does not spread over the entire preliminary solder 770. For this reason, the contacts 753 and the heater lands 46 cannot be firmly soldered only with the preliminary solder 770.

Figure 5D:
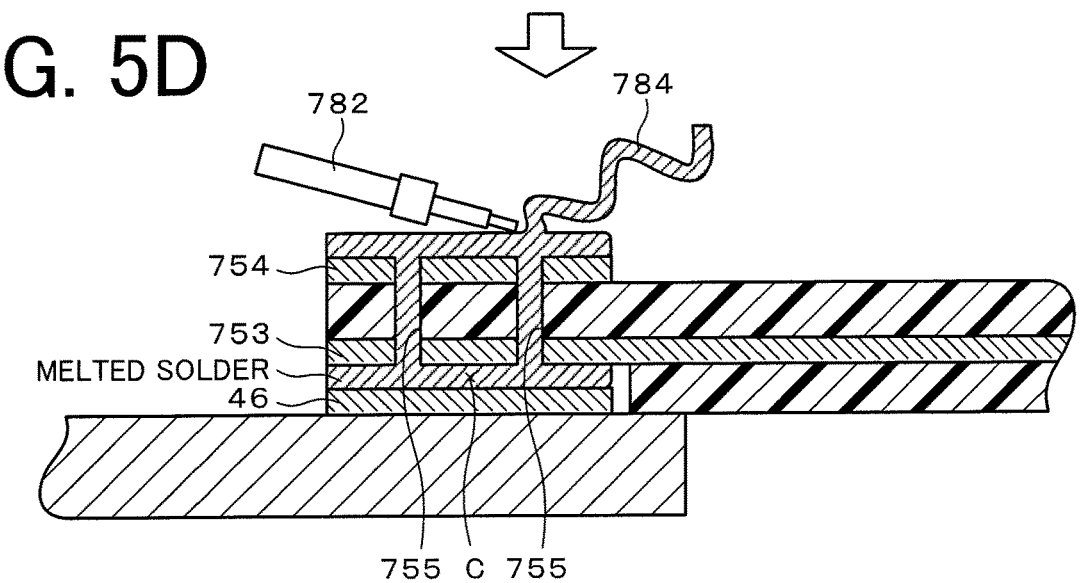
Figure 6A:
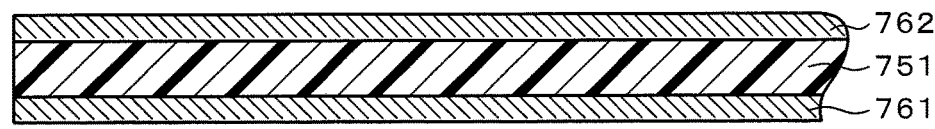
FIGS. 6A to 6D include explanatory views illustrating a production process for a connection FPC 75.
Figure 6B:
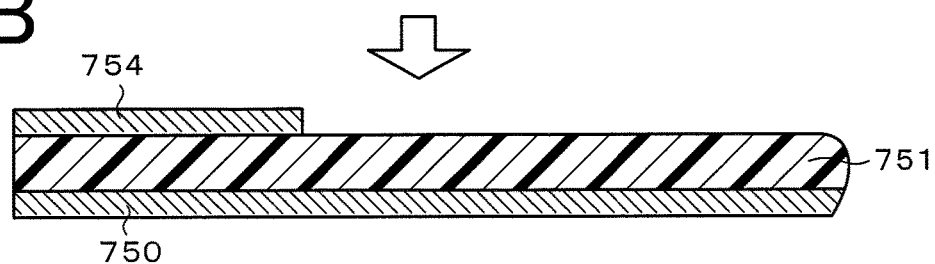
Figure 6C:
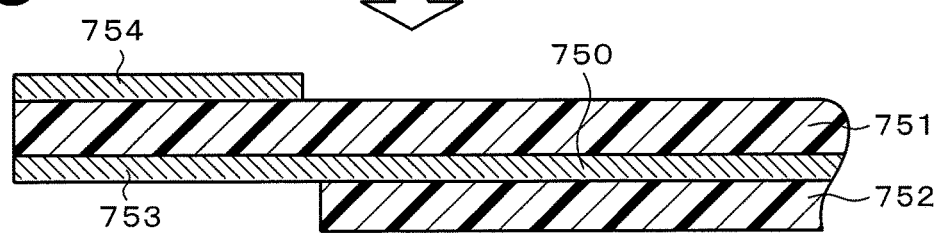
Figure 6D:
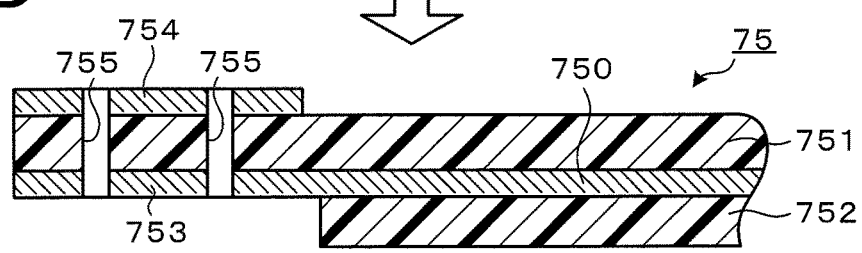

Next, as illustrated in FIG. 5D, wire solder 784 is melted with a soldering iron 782 while being pressed against upper surfaces of the contact opposed lands 754. Then, the melted solder enters the through holes 755 from the contact opposed lands 754, passes through the through holes 755, and is supplied to the bonding space C. For this reason, the melted solder is more easily supplied to the bonding space C than when the contact opposed lands 754 and the through holes 755 are not provided. As a result, it is possible to avoid the problem in that bonding is insufficient because the solder is not enough in the bonding space C. Further, the contact opposed lands 754 are also heated, heat of the contact opposed lands 754 is transmitted to the bonding space C via the support layer 751, and heat of the melted solder is also transmitted to the bonding space C. For this reason, the bonding space C is entirely heated to high temperature. As a result, the melted solder supplied to the bonding space C easily and uniformly wets and spreads inside the bonding space C. Further, the preliminary solder 770 is melted by heat transfer, and combines with the melted solder supplied to the bonding space C. After that, the melted solder is hardened into a solder bonding member 756. The hardened bonding member serving as a brazing and soldering material covers the surfaces of the first contact opposed lands, and is filled inside the first through holes and the bonding space. The solder bonding member 756 covers the surfaces of the contact opposed lands 754, and is filled inside the through holes 755 and in the bonding space C.

Next, a description will be given of a usage example of the plasma treatment apparatus 10 thus configurated. First, a wafer W is placed on the wafer mounting surface 22a of the electrostatic chuck 22. Then, the inside of the vacuum chamber 12 is adjusted to a predetermined vacuum degree by being depressurized by a vacuum pump. A coulomb force or a Johnson-Rahbeck force is generated by applying a direct-current voltage to the electrostatic electrode 24 of the electrostatic chuck 22, and the wafer W is thereby attracted and fixed to the wafer mounting surface 22a of the electrostatic chuck 22. Next, the inside of the vacuum chamber 12 is made into a process gas atmosphere with a predetermined pressure (for example, several tens of pascals to several hundreds of pascals). By applying a high-frequency voltage between the shower head 14 and the support pedestal 60 in this state, plasma is generated. The surface of the wafer W is etched by the generated plasma. Meanwhile, an unillustrated controller performs control so that the temperature of the wafer W reaches a predetermined target temperature. Specifically, the controller receives a detection signal from a temperature measuring sensor (not illustrated) for measuring the temperature of the wafer W, and controls the current to be supplied to the reference heater electrodes 44, the current to be supplied to the correction heater electrodes 34, and the temperature of the refrigerant to circulate in the refrigerant flow passage 62 so that the measured temperature of the wafer W coincides with the target temperature. In particular, the controller finely controls the current to be supplied to the correction heater electrodes 34 so that a temperature distribution does not occur in the wafer W. The temperature measuring sensor may be embedded in the resin sheet 32 or may be bonded to the surface of the resin sheet 32.

The corresponding relations between the constituent elements of the embodiment and the constituent elements of the present invention will now be clarified. The connection FPC 75 of the embodiment corresponds to the first member of the present invention, the sheet heater 30 corresponds to the second member, and the solder bonding member 756 corresponds to the bonding member. Also, the support layer 751 of the connection FPC 75 corresponds to the first support layer, the covering layer 752 corresponds to the first covering layer, the metal wires 750 correspond to the first metal wires, the contacts 753 correspond to the first contacts, the contact opposed lands 754 correspond to the first contact opposed lands, and the through holes 755 correspond to the first through holes. The resin sheet 32 of the sheet heater 30 corresponds to the second support layer, and the heater lands 46 correspond to the second contacts.

According to the above-described metal wiring bonding structure 100, the problem in that bonding is insufficient because the solder is not enough in the bonding space C is avoided. Moreover, since the solder uniformly wets and spreads inside the bonding space C, the contacts 753 of the connection FPC 75 are firmly bonded to the heater lands 46 of the sheet heater 30. Moreover, since a plurality of (two in this case) through holes 755 are provided for each one contact 753, the solder melted at the contact opposed lands 754 efficiently reaches the bonding space C. Further, since the through holes 755 have a circular cross section, the solder melted at the contact opposed lands 754 can smoothly pass through the through holes 755.

It is needless to say that the present invention is not limited to the above-described embodiment and can be carried out in various embodiments as long as they belong to the technical scope of the invention.

Figure 7A:
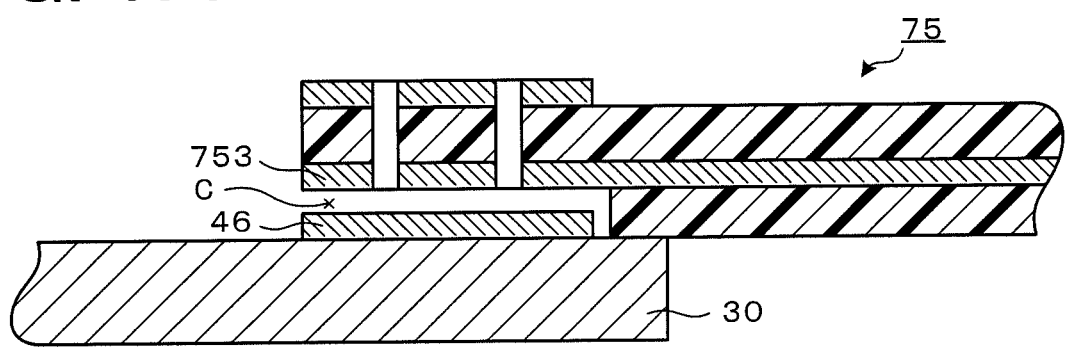
FIGS. 7A and 7B include explanatory views illustrating another production process for the metal wiring bonding structure 100.
Figure 7B:
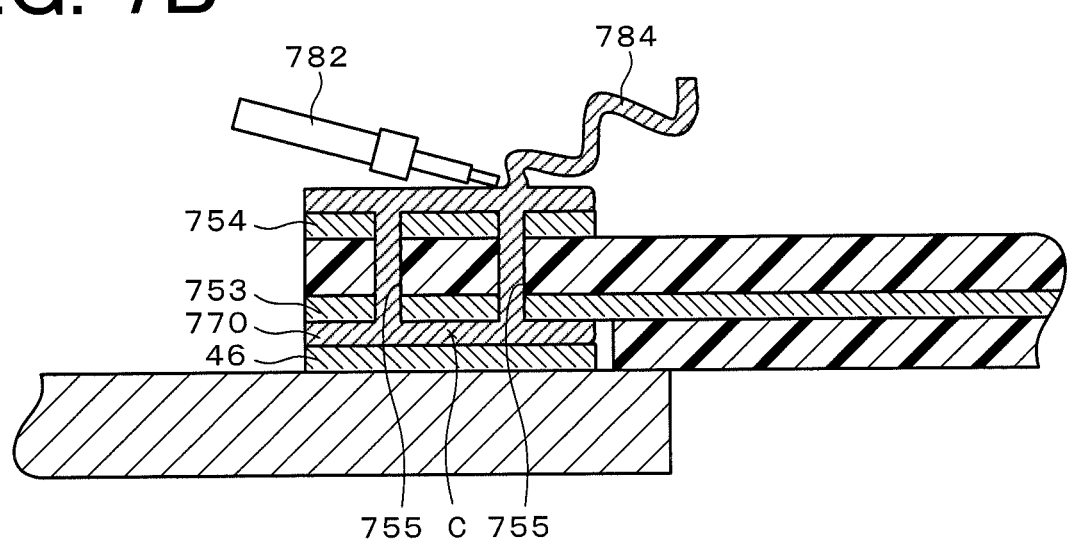

While the contacts 753 of the connection FPC 75 and the heater lands 46 of the sheet heater 30 are temporarily bonded with the preliminary solder 770 in the above-described embodiment, they do not particularly need to be temporarily bonded with the preliminary solder 770. FIG. 7 show an example. First, as illustrated in FIG. 7A, the bonding space C is made empty. At this time, the contacts 753 of the connection FPC 75 and the heater lands 46 of the sheet heater 30 are preferably fixed, for example, with a tape or a jig (not illustrated) so as not to deviate from the positions opposed to each other. Next, as illustrated in FIG. 7B, wire solder 784 may be melted by the soldering iron 782 while being pressed against the upper surfaces of the contact opposed lands 754, and the melted solder may be supplied from the contact opposed lands 754 to the bonding space C through the through holes 755. In this case, the solder melted at the contact opposed lands 754 is also supplied to the bonding space C through the through holes 755. For this reason, the solder is more easily supplied to the bonding space C than when the contact opposed lands 754 and the through holes 755 are not provided. As a result, it is possible to avoid the problem in that bonding is insufficient because the solder is not enough in the bonding space C. Further, the contact opposed lands 754 are also heated, heat thereof is transmitted to the bonding space C via the support layer 751, and heat of the melted solder is also transmitted to the bonding space C. For this reason, the bonding space C is entirely heated to high temperature. As a result, the solder supplied to the bonding space C easily and uniformly wets and spreads inside the bonding space C. Therefore, similarly to the above-described embodiment, the contacts 753 and the heater lands 46 are firmly bonded. In this way, the contacts 753 and the heater lands 46 are firmly bonded without being temporarily bonded with the preliminary solder 770.

Figure 8:
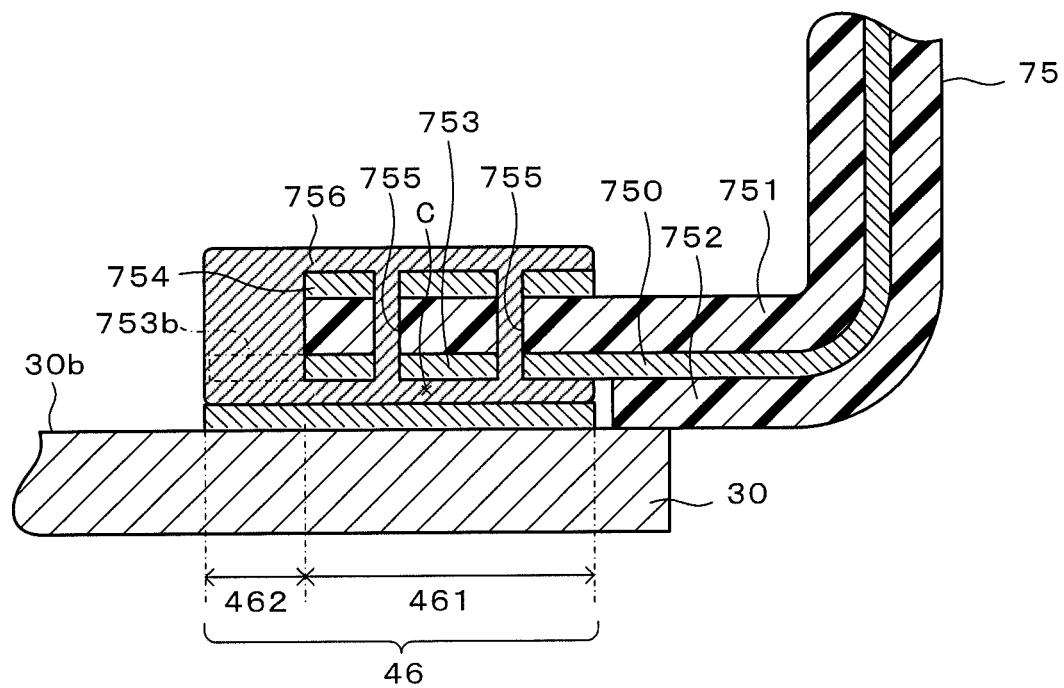
FIG. 8 is a cross-sectional view of a modification of the metal wiring bonding structure 100.
Figure 9A:
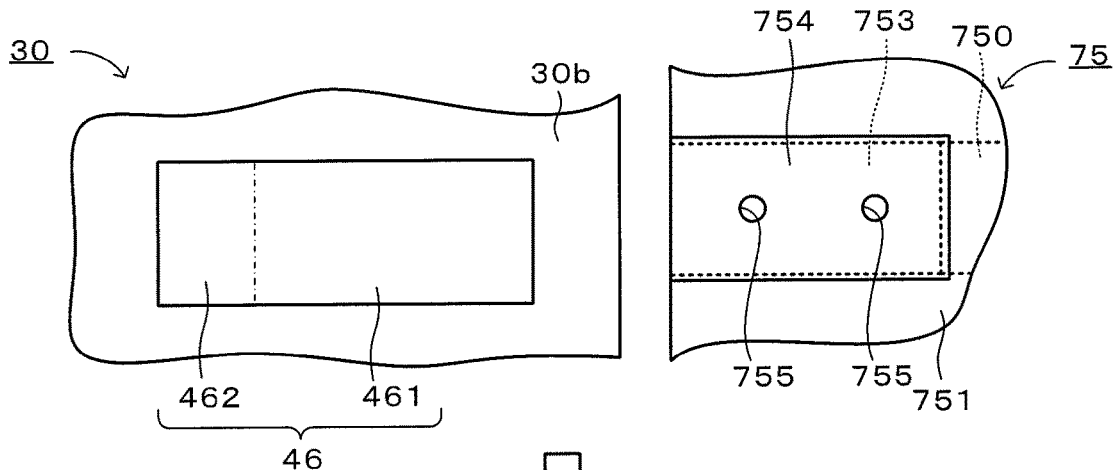
FIGS. 9A to 9C include explanatory views illustrating a process for aligning the connection FPC 75 with the sheet heater 30.
Figure 9B:
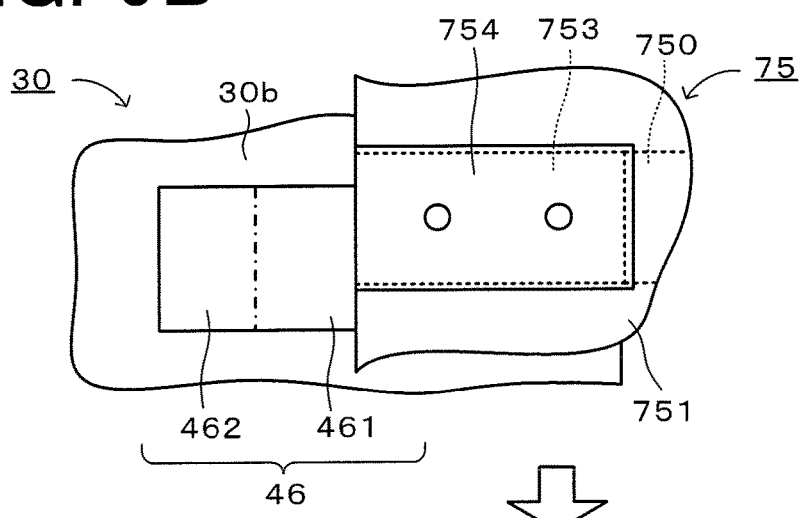
Figure 9C:
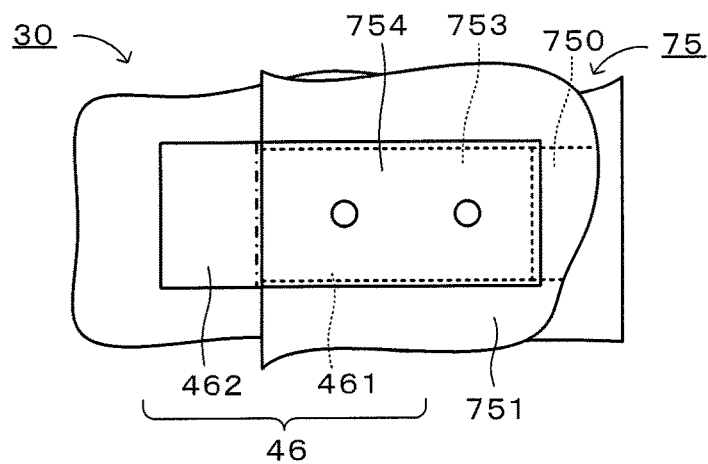
Figure 10:
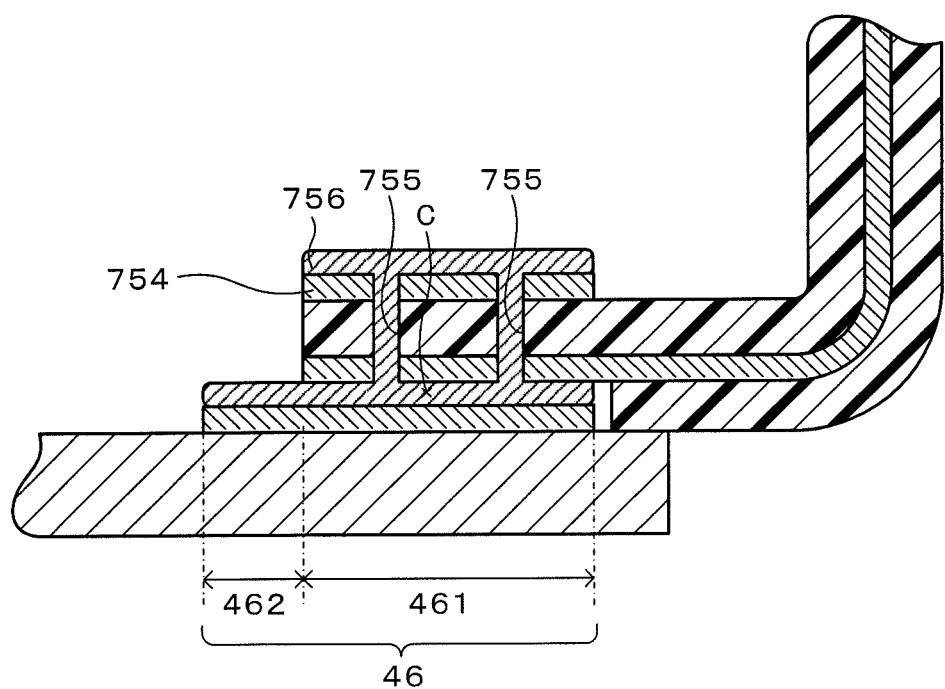
FIG. 10 is a cross-sectional view of a modification of the metal wiring bonding structure 100.

In the above-described embodiment, as illustrated in FIG. 8, the heater lands 46 may respectively include extended surfaces 462 opposed to imaginary extended portions 753b imaginarily extended ahead from the contacts 753 in addition to base surfaces 461 opposed to the contacts 753. The solder bonding member 756 may cover the surfaces of the contact opposed lands 754, a distal end surface of the connection FPC 75, and the extended surfaces 462 of the heater lands 46 in the sheet heater 30, and may be filled inside the through holes 755 and in the bonding space C between the contacts 753 and the heater lands 46. In this case, the portions of the solder bonding member 756 that cover the surfaces of the contact opposed lands 754 and the distal end surface of the connection FPC 75 can be inspected (for example, visually checked) from the outside. Hence, the connection state can be easily checked. Further, when the contacts 753 of the connection FPC 75 are positioned to be opposed to the heater lands 46, the extended surfaces 462 of the heater lands 46 and the contact opposed lands 754 of the connection FPC 75 are both seen from above the connection FPC 75. By utilizing these elements, positioning can be easily performed. FIG. 9 illustrate a manner in which one contact 753 of the connection FPC 75 is aligned with one heater land 46 from above in a state in which the lower surface 30b of the sheet heater 30 faces upward. A one-dot chain line is an imaginary line that divides the heater land 46 into a base surface 461 and an extended surface 462. At the time of bonding, the sheet heater 30 and the connection FPC 75 are moved closer to each other from a separate state (see FIG. 9A) so that the contact opposed land 754 of the connection FPC 75 overlaps with the heater land 46 exposed from the lower surface 30b of the sheet heater 30 (see FIG. 9B). Then, the connection FPC 75 is placed so that the base surface 461 of the heater land 46 is covered with the contact opposed land 754 (see FIG. 9C). At this time, the connection FPC 75 is placed so that the rectangle of the contact opposed land 754 and the rectangle surrounding the extended surface 462 of the heater land 46 are combined to form one rectangle. Thus, the contact 753 provided on the hack side of the contact opposed land 754 faces the base surface 461 having the same size as that of the contact 753. When the heater land 46 has the extended surface 462, as illustrated in FIG. 10, the connection state of the solder may be checked by finding that the solder bonding member 756 is supplied from the contact opposed land 754 to the bonding space C through the through holes 755 and seeps out on the extended surface 462.

Figure 11:
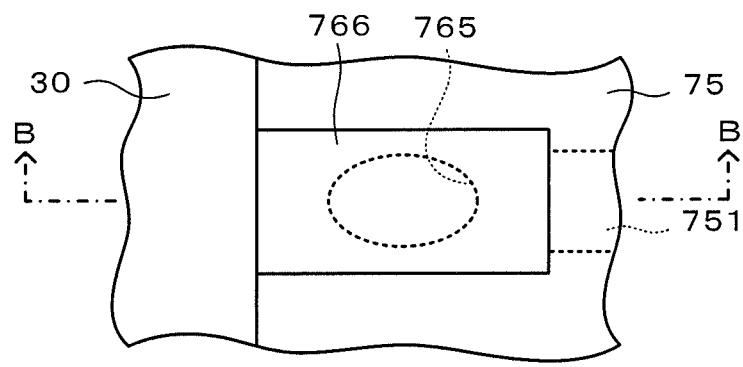
FIG. 11 is a plan view of a modification of the metal wiring bonding structure 100.
Figure 12:
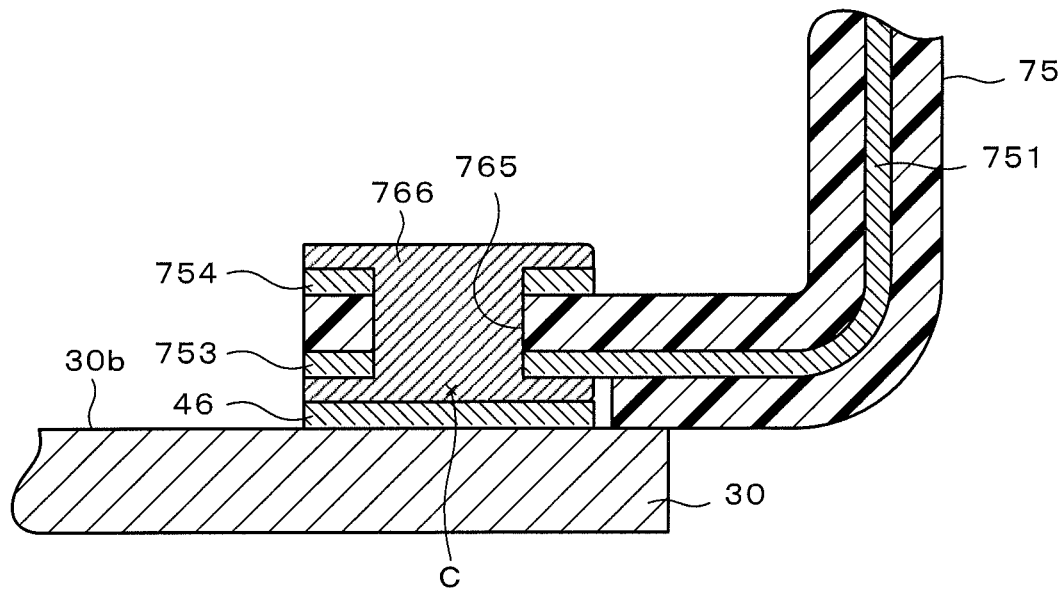
FIG. 12 is a cross-sectional view taken along line B-B of FIG. 11.
Figure 13:
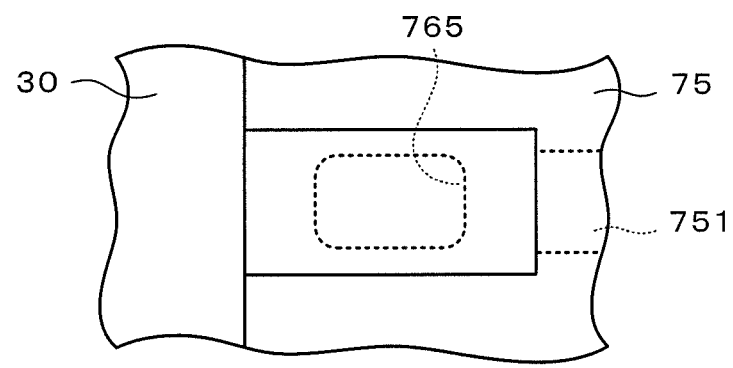
FIG. 13 is a plan view of a modification of the metal wiring bonding structure 100.

In the above-described embodiment, as illustrated in FIG. 11, the cross section of through holes 765 may have an elliptic shape (shape when viewed from above), and the connection FPC 75 and the sheet heater 30 may be bonded by a solder bonding member 766. Usually, the contacts 753 of the connection FPC 75 are often shaped like a rectangle (its longer side extends in the extending direction of the metal wire 750) when viewed front above. For this reason, when the through holes 765 of elliptic cross section are provided so that their longer diameter extends along the longer side of the rectangle, the aperture area of the through holes 765 can be increased. As a result, as illustrated in FIG. 12, solder melted at the contact opposed lands 754 efficiently reaches the bonding space C between the contacts 753 and the heater lands 46. Therefore, the contacts 753 of the connection FPC 75 and the heater lands 46 of the sheet heater 30 are more firmly bonded by the solder bonding member 766. Further, the cross-sectional area of the through holes 765 can be ensured while ensuring the remaining area of the contact opposed lands 754 after the through holes 765 are opened. Alternatively, as illustrated in FIG. 13, the cross section of the through holes 765 may be shaped like a rectangle with round corners (when viewed from above). Since this can increase the cross-sectional area of the through holes 765, solder and heat easily pass therethrough.

Figure 14:
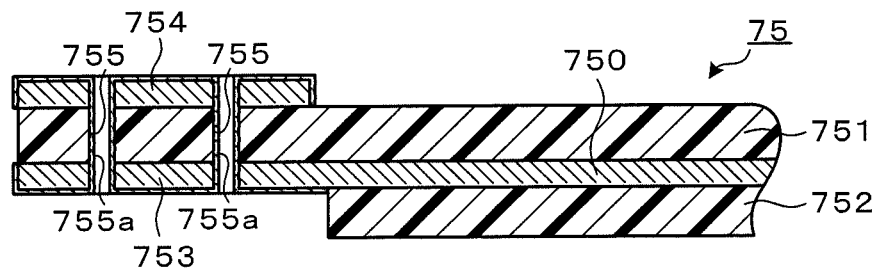
FIG. 14 is a cross-sectional view of a modification of the connection FPC 75.
Figure 15:
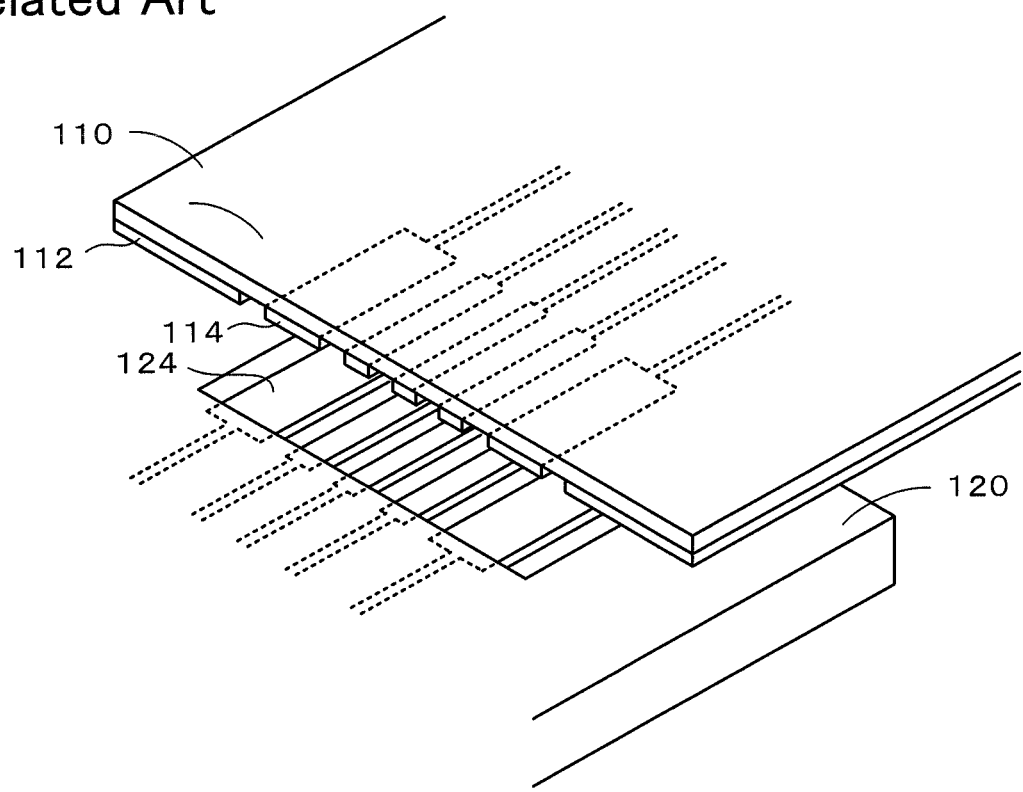
FIG. 15 is a perspective view of a conventional metal wiring bonding structure.

In the above-described embodiment, inner walls of the through holes 755 may be covered with metal films. For example, when the connection FPC 75 is machined, through holes 755 penetrating the contact opposed lands 754, the support layer 751, and the contacts 753 in the up-down direction may be formed with a drill or a laser (see FIG. 6D), and after that, metal layers 755a may be formed on the inner walls of the through holes 755 by utilizing electroless plating, sputtering, or electroplating (see FIG. 14). As the material of the metal layers 755a, for example, Cu, Ni, Au, and Sn can be used. In this case, the solder melted at the contact opposed lands 754 easily wets and spreads on the inner walls of the through holes 755.

While the connection FPC 75 is provided as the first member and the sheet heater 30 is provided as the second member in the above-described embodiment, the present invention is not particularly limited to this combination. For example, a flat cable may be used as the first member, and a printed wiring board may be used as the second member.

The present application claims priority from U.S. Provisional Application No. 62/314,547 and U.S. Provisional Application No. 62/314,556, filed on Mar. 29, 2016, and Japanese Patent Application No. 2016-128765 and Japanese Patent Application No. 2016-128766, filed on Jun. 29, 2016, the entire contents of which are incorporated herein by reference.

What is claimed is:

1. A metal wiring bonding structure comprising:
a first member having a plurality of first metal wires between a first support layer formed of resin and a first covering layer formed of resin, and a plurality of first contacts, each first contact defining an end portion of one respective first wire of the plurality of the first metal wires, and exposed from the first covering layer;
a second member having a plurality of second contacts on a surface of a second support layer formed of resin, each second contact of the plurality of the second contacts being disposed opposed to the each first contact of the plurality of first contacts; and
a bonding member that brazes and solders the each first contact of the plurality of first contacts and the each second contact of the plurality of second contacts,
a plurality of first contact opposed lands, each first contact opposed land being formed of metal and disposed at a position respectively opposed to the each first contact of the plurality of first contacts on a surface of the first support layer opposite from a surface on which the plurality of first metal wires is provided, and a plurality of first through holes penetrating the each first contact of the plurality of first contacts, and
the bonding member covers surfaces of the plurality of the first contact opposed lands and is filled inside the plurality of first through holes and in a bonding space between the each first contact of the plurality of first contacts and the each second contact of the plurality of second contacts,
wherein the second member is a sheet heater functioning as a heater and disposed between an electrostatic chuck and a support pedestal formed of metal, and
the first member is inserted in a through hole of the support pedestal to be bonded to the second member.

2. The metal wiring bonding structure according to claim 1, wherein each first through hole of the plurality of first through holes has a transverse cross section shaped like one of a circle, an ellipse, or a rectangle with round corners.

3. The metal wiring bonding structure according to claim 1, wherein inner walls of each first through hole of the plurality of first through holes are covered with metal films.

4. The metal wiring bonding structure according to claim 1,
wherein a number of the plurality of first through holes provided for the each first contact of the plurality of first contacts is two or more.

5. The metal wiring bonding structure according to claim 1,
wherein the each second contact of the plurality of second contacts includes at least one extended surface opposed to a respective at least one imaginary extended portion extended ahead from the each first contact of the plurality of first contacts in addition to base surfaces opposed to the each first contact of the plurality of first contacts, and
the bonding member covers the surfaces of the first contact opposed lands, a distal end surface of the first member, and the at least one extended surface of each second contact of the plurality of second contacts, and is filled inside the plurality of first through holes and in the bonding space.

6. The metal wiring bonding structure according to claim 1, wherein the first member is a flexible printed circuit board.

7. A production method for producing the metal wiring bonding structure according to claim 1 including the steps of;
(a) a step of preparing:
said first member, and
said second member;
(b) a step of heating and melting a brazing and soldering material in contact with the first contact opposed lands in a state in which the first contacts and the second contacts are opposed to each other, supplying the melted brazing and soldering material from the first contact opposed lands to a bonding space between the first contacts and the second contacts through the plurality of first through holes, and in case the first contacts and the second contacts are temporarily bonded with a preliminary brazing and soldering material beforehand, melting the preliminary brazing and soldering material by heat transfer; and
(c) a step of hardening the entire brazing and soldering material.

8. The production method according to claim 7,
wherein the plurality of first through holes have a transverse cross section shaped like a circle, an ellipse, or a rectangle with round corners.

9. The production method according to claim 7,
wherein inner walls of the plurality of first through holes are covered with metal films.

10. The production method according to claim 7,
wherein a number of the plurality of first through holes provided for each of the first contacts is two or more.

11. The production method according to claim 7,
wherein the second contacts include extended surfaces opposed to imaginary extended portions imaginarily extended ahead from the first contacts in addition to base surfaces opposed to the first contacts, and,
in the step (b), further, the melted brazing and soldering material is supplied so as to reach from the first contact opposed lands to the bonding space through a distal end surface of the first member and the extended surfaces of the second contacts.

* * * * *